United States Patent [19]
Faucett

[11] Patent Number: 4,769,596
[45] Date of Patent: Sep. 6, 1988

[54] PRINTED CIRCUIT BOARD TESTER

[76] Inventor: Dale L. Faucett, 4901 E. Pierce St., Scottsdale, Ariz. 85257

[21] Appl. No.: 726,053

[22] Filed: Apr. 23, 1985

[51] Int. Cl.⁴ .............................................. G01R 31/08
[52] U.S. Cl. ............................. 324/73 PC; 324/158 F
[58] Field of Search ................ 324/556, 73 R, 73 PC, 324/158 F, 539, 542

[56] References Cited

U.S. PATENT DOCUMENTS

| | | | |
|---|---|---|---|
| 4,017,793 | 4/1977 | Haines | 324/73 PC |
| 4,227,146 | 10/1980 | Hodge | 324/542 |

FOREIGN PATENT DOCUMENTS

| | | | |
|---|---|---|---|
| 2038567 | 7/1980 | United Kingdom | 324/158 F |
| 1022081 | 6/1983 | U.S.S.R. | 324/73 R |

Primary Examiner—Reinhard J. Eisenzopf
Assistant Examiner—Stephen M. Baker
Attorney, Agent, or Firm—Charles P. Padgett, Jr.

[57] ABSTRACT

An apparatus for simultaneously testing a large plurality of conductive paths on a bare printed circuit board for short circuit and open circuit conditions. The bare printed circuit board has a rear surface which includes a plurality of terminals located at the opposite ends of the conductive paths to be tested and a plurality of terminal-engaging electrical contacts are provided for operatively engaging the terminals on the rear of the printed circuit boards when the two are forced together. A first set of LEDs on a display panel is used to test for shorts and a second set of LEDs is used to test for open circuits, and a single glance at the display will indicate, not only the presence of a short or open circuit condition, but the exact location thereof.

40 Claims, 6 Drawing Sheets

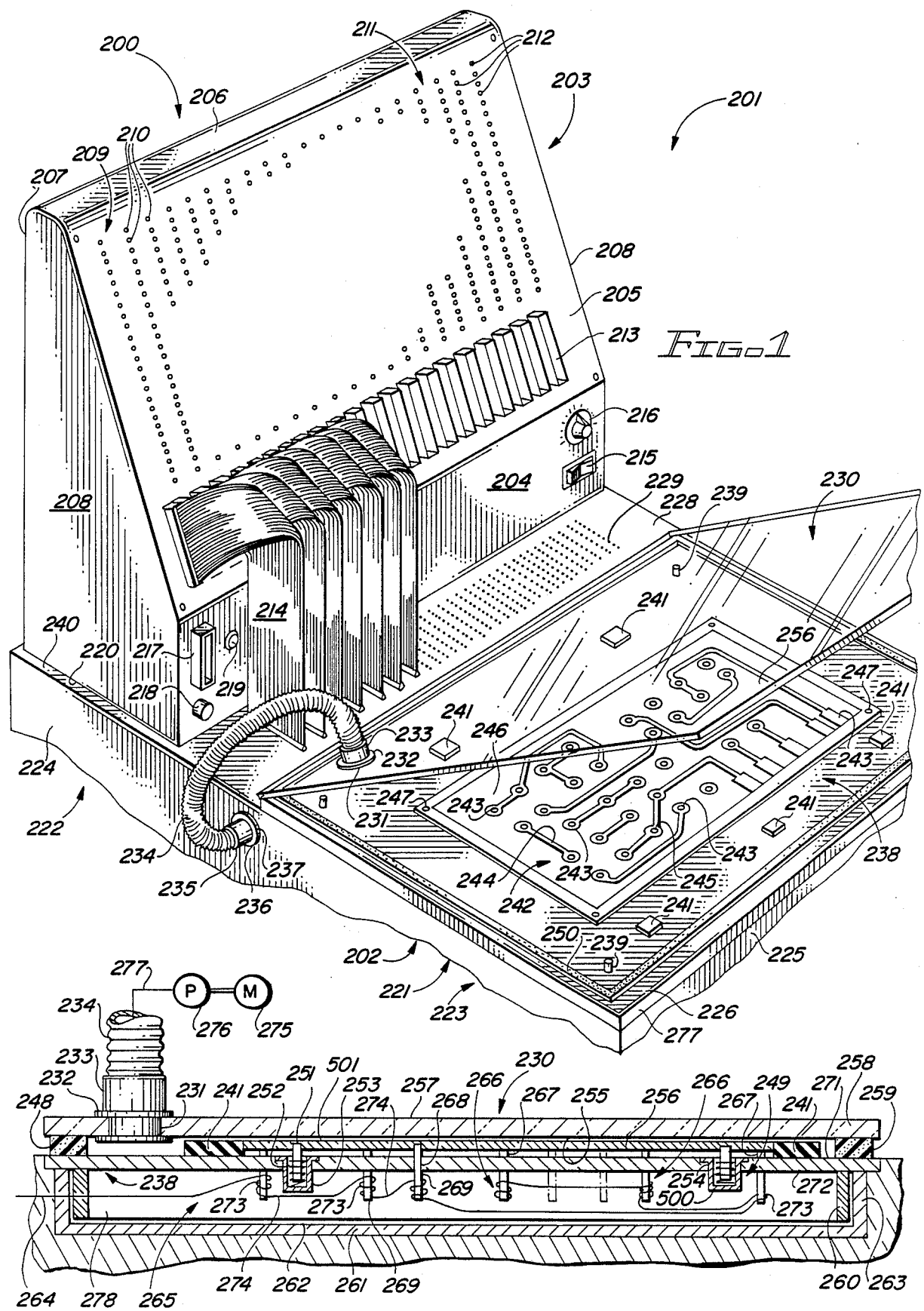

PRINTED CIRCUIT BOARD TESTER

BACKGROUND OF THE INVENTION

1. Field Of The Invention

The present invention relates to a bare printed circuit board tester, and more particularly, to a bare printed circuit board tester for simultaneously testing a large number of conductive paths on a bare printed circuit board for open circuit and short circuit conditions.

2. Description Of The Prior Art

The testing, checking, verifying, and/or "buzzing" of each of a large number of conductive paths on a bare printed circuit board or the like with a multimeter or by visually scanning the printed circuit board has previously been used in the prior art for testing for both short circuit and open circuit conditions. Typically, such prior art tests and test systems are neither cost effective nor reliable, and they result in a great loss of time and added expense of the finished printed circuit board. Nonetheless, such methods continue to be used with a large number of circuits produced by at least the smaller printed circuit board manufacturers today.

While some types of computer-controlled testing systems are used for testing printed circuit boards, they are extremely complex, time consuming, and expensive. For example, the cost of such systems is generally in the range of hundreds of thousands of dollars, or ten or more times the cost of the present system.

It is, therefore, an object of the present invention to provide a method and apparatus for simultaneously testing for both short circuit and open circuit conditions in a bare printed circuit board having a large number of conductive paths, with the testing of the conductive paths being done simultaneously so that open circuits and short circuit conditions can be quickly detected and visually located for all of said conductive paths under test in an extremely short period of time, such as under five seconds.

It is a further object of the present invention to provide a relatively low cost system for performing short and open circuit tests in a minimal amount of time.

It is still a further object of the present invention to provide a method and apparatus for testing for shorts and opens for a large number of conductive paths while simultaneously visually indicating both the presence of shorts and opens and the location thereof on an LED display panel.

It is still a further object of the present invention to provide voltage divider circuitry to enable a relatively large value of DC voltage to be applied to the LEDs for driving an extremely large number thereof without damaging the remainder of the circuit.

It is a further object of the present invention to provide a test station wherein a simple change in the terminal-engaging contact board can be made for testing a different bare printed circuit board simply by programming a new terminal-engaging contact board from the artwork used to generate the new printed circuit board to be tested.

It is still a further object of the present invention to provide a quick and efficient confirmation of assembly quality of bare printed circuit boards while allowing rapid AQL or even 100% testing on incoming printed circuit boards.

It is still another object of the present inventior to provide a test device which enables a field service person to quickly locate and identify short circuit and open circuit conditions in the field or on site by a mere visual scanning of the instrument.

It is yet another object of this invention to provide a shorts and opens tester which can be used in the manufacture of multilayered printed circuit boards to test each layer separately before the next is added.

It is still another object to provide a method and apparatus for simultaneously testing all conductive paths in even the most complex bare printed circuit boards quickly and accurately.

SUMMARY OF THE INVENTION

The present invention teaches a method and apparatus for testing a relatively large number of conductive paths on a bare printed circuit board for short circuit and open circuit conditions. Additionally, the testing apparatus simultaneously locates the detected short circuit and open circuit conditions in a very small amount of time, such as under five seconds or the like.

The bare printed circuit board under test has an upper surface for mounting electrical components and a lower surface, back surface, or backplane, having a plurality of terminals or test points thereon. The test points on the backplane correspond to end points of conductive paths on the circuit board to be tested and may include end points of the complete conductive path or an end point and some test point therealong or even two test points therealong, all of which will be referred to collectively as end points or test points hereinafter, since that portion between adjacent test points or end points will be defined as one of the conductive paths to be tested, and therefore, the test points will become end points and vice versa for that particular conductive path.

The system includes a cabinet portion having a visual display panel and a housing. The display panel includes a first array or pattern of LEDs from a first set or group of LEDs and a second array or pattern of LEDs from a second set or group of LEDs. The LEDs from the two sets may have different colors, if desired.

The housing includes means for defining a hollow interior or cavity portion and a text fixture board mount or carrier a plurality of test point-engaging electrical contacts configured in a pattern determined by the printed circuit board artwork used to make the bare printed circuit board under test is provided with the contacts corresponding to at least the end points in each conductive path to be tested.

Means are provided for positioning the printed circuit board under test with the lower surface disposed towards the plurality of test point-engaging electrical contacts of the pattern and spaced a predetermined distance therefrom and in alignment therewith. Electrical conductive means is provided for operatively connecting a different and distinct one of said first group of said LEDs in series between one end point of one conductive path to be tested and an end point of another conductive path to be tested until all of the conductive paths to be tested are connected in a single series-connected circuit path through said first set of LEDs.

The electrical conductive means also includes means for operatively connecting an LED from the second set of LEDs in parallel across each of the conductive paths by connecting the corresponding opposite end terminal-engaging contacts of said pattern configuration.

When the lower surface of the printed circuit board under test is brought into contact with the test point-engaging contacts of the pattern, electrical power is applied thereto. At this time, the LEDs of the first set of LEDs will be normally ON indicating the absence of the short circuit condition in the conductive paths under test. However, the LEDs of the first group or set are responsive to the detection of a short circuit condition for turning OFF as an indication of the detection thereof. The location of the detected short circuit condition is defined as existing between the last LED of the first set of LEDs which is ON before the first which is OFF and the last which is OFF before the first which is ON thereafter.

Simultaneously, the individual LEDs of the second set of LEDs are normally OFF, indicating the absence of an open circuit condition, but the LEDs of said second set switch ON to indicate the existance or detection df an open circuit condition. The location of the detected open circuit condition is defined as lying within the conductive path tested in which the illuminated LED is connected in parallel.

BRIEF DESCRIPTION OF THE DRAWINGS

FIG. 1 is a perspective view of the bare printed circuit board testing apparatus of the present invention;

FIG. 2 is a sectional front view of the printed circuit board testing apparatus of FIG. 1;

DETAILED DESCRIPTION OF THE DRAWINGS

Figure 3:
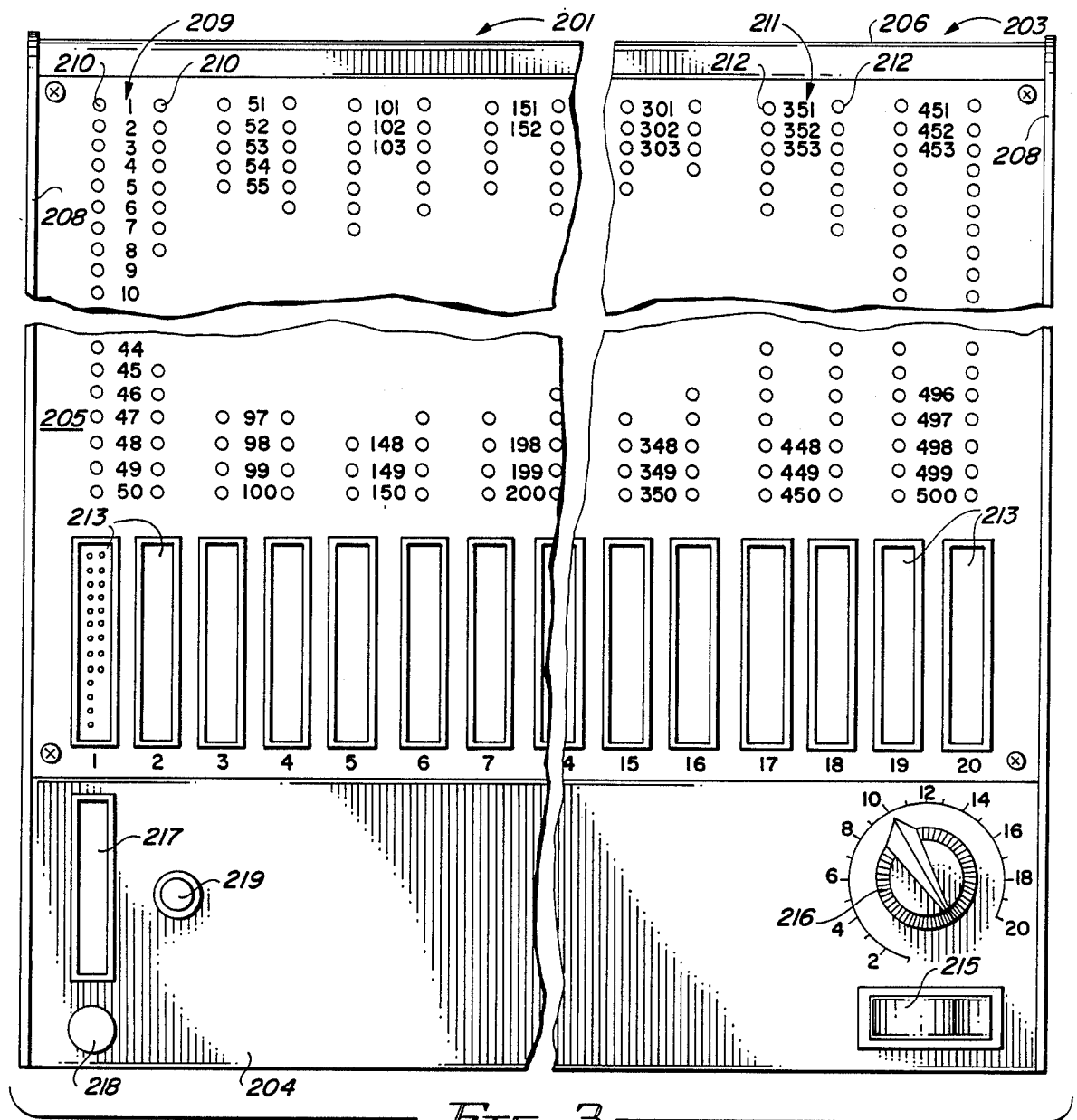
FIG. 3 is a front plan view of the display panel portion of the printed circuit board testing apparatus of FIG. 1.

FIG. 1 shows the bare printed circuit board testing system 200 of the present invention as including a testing cabinet 201 having a test fixture housing or housing portion 202 and a display panel 203. The display panel 203 is generally trapazoidal in structure having a front vertical panel 204, a rear vertical panel 207, vertical side panels 208, a relatively horizontal or slightly rounded top portion 206, and a slanted portion, face, or surface 205 tapering back from the front surface 205 toward the rear surface 207 at the top 206.

The display panel 203 itself is operably disposed on the slanted surface 205 and includes a symmetrical array, generally including rows and columns, of a first plurality of illumination means which are preferably light-emitting diodes (LEDs) in the preferred embodiment of the present invention. The first set or group of LEDs is referred to by reference numeral 209 while the individual LEDs of the first group or set are referred to as LEDs 210. Similarly, there is a second, different and distinct group of LEDs given reference numeral 211 with the individual LEDs of the second group being referred to by reference numeral 212. If desired, the LEDs 210 of the first group 209 may include a first color and the LEDs 212 of the second group 211 may include a second different and distinct color.

Near the bottom of the sloped surface 205 a row of connector sockets 213 are disposed. The connector sockets 213 are conventional sockets for engaging ribbon cables or the like, as known in the art, and a plurality of ribbon cables 214 extend from the sockets 213 to corresponding sockets 229 in the top 228 of the housing 202, as hereinafter described. The vertical front panel 204 of the display panel 203 includes an AC power on/power off switch 205; a rotary decade switch or voltage selector 216 for selecting the number of pairs of ribbon (cables required and hence the number of conductive paths to be tested); a cable socket 217 which can be connected through a cable test head to pick up contacts (JO.1 and JO.2) on S3 which close when the vacuum pulls the cover 230 down and/or which can be used to connect a foot-operated switch; a vacuum on/-vacuum off toggle switch 219; and a power on indicator light or LED 218.

The housing portion 202 of the cabinet 201 of the testing apparatus 200 of the present invention includes a general box-like structure 221 having a rear portion 222 and a front portion 223. A lower surface or base 220 of the display panel 203 is operably disposed upon the relatively flat upper surface 240 of the rear portion 222 of the box-like structure 221. The box-like structure 221 also includes a pair of generally vertical sides 224, a generally vertical front panel 225, and a peripheral lip or edge 226 surrounding and/or defining a hollow interior or cavity 265 for housing the test fixture board assembly 238, as hereinafter described, within the box-like structure 221.

The housing 202 includes a generally transparent or transluscent plastic cover 230 which hinges about a foam pad or seal 248, as shown in FIG. 2. An intermediate portion comprising the flat horizontal surface 228 between the rear portion 222 and the front portion 223 contains a plurality of cable sockets or conventional sockets 229 for engaging the opposite ends of the ribbon cables 214, as known in the art.

A foam-like sealing member 250 for providing cushioning for the cover 230 and for providing an air tight vacuum seal about the cavity 265 is operably disposed, as shown, peripherally about the rectangular lip 226. Alternately, a continuous strip of sealing material 250 could be secured in a rectangular configuration on the bottom of the cover 230. A number of foam pads 241 are used as standoffs and the like for protection purposes, as are a plurality of standoff pins 239. A conventional bare printed circuit board to be tested is designated as 242, and it is shown as including a non-conductive printed circuit board portion 246 and a plurality of conductive portions including terminals 243, conductive paths or lands 244, and intermediate test points 245. Alignment aperatures may be provided about the periphery or within a central area of the printed circuit board 242, as designated by aperatures 247, to engage vertical alignment pins 239 in the underlying test fixture board 238, as described in FIG. 2. An aperature 231 in the surface 256 of the cover 230 is provided, and a seal 232 is disposed between the aperature 231 and a vacuum inlet portion 233 of hose 234. The inlet 233 is connected through a vacuum conduit or vacuum hose 234 to a vacuum outlet portion 235 which is sealed via 236 through an aperature 237 in the side panel 224 of the housing 202, for use as hereinafter described with reference to FIG. 2.

FIG. 2 shows a sectional front view of the printed circuit board testing apparatus 200 of FIG. 1. In FIG. 2, a printed circuit board 242 is shown as being disposed upon the guide pin assemblies 249 within the test fixture board 238. Each of the guide pin assemblies 249 includes a generally cup-shaped, hollow portion 253 having an annular lip portion 254 with the hollow distending portion 253 disposed within an aperature 254 in the board 238. The annular lip engages the upper surface of the board about the aperature 254 thereof to maintain the pin assembly 249 in position. The pin 251 is spring-biased via spring member 252 within the hollow cavity 500 of the cupped-shaped portion 253 so the pin can be depressed or lowered under force and raised or lifted under the spring bias without damage to the board 242.

However, when an alignment aperature 247 in the printed circuit board 242 engages or receives the pin 251, the printed circuit board 242 is aligned with respect to the underlying test fixture board 238 and is in a "test ready" position. The foam pads 241 may engage the ends of the printed circuit board 242 or may be arranged to allow the peripheral portions of the printed circuit boards to rest thereon, as desired. The printed circuit board 242 is normally mounted within the hollow interior or cavity 265 above the test fixture board 238 on the pins 251 such that the springs 252 and/or pads 241 hold the printed circuit board a short distance away from the ends of the pogo pin assemblies or test point-engaging contacts 266 mounted in the test fixture board 238. The pogo pin assemblies 249 include a pin or contact portion 267 which extends vertically ppward from the planar surface 271 of the test fixture board 238, an intermediate receptacle portion 268 disposed within an aperature 540 of board 238, and a lower elongated, vertically distending stem, base, or connector portion 269. The upper end of the pins or contacts 267 are spacially separated a predetermined distance from the underside or lower surface 255 of the printed circuit board 242 but the upper ends make electrical contact therewith when a vacuum is created within the hollow interior 265. The posts or bases 269 are wrapped with wire 273, which is then used to connect the predetermined end points, and/or end points to test points, and/or test points to test points, prior to being formed into wire bundles 278 for connection through the ribbon cables 214 back to the appropriate first or second groups of LEDs 209, 211, respectively, of display panel 203.

A motor 275 is used to operate a vacuum pump 276 which draws a suction via conduit 277/234 and a vacuum inlet 233 such that the air is suctioned from the hollow interior 265 of the cavity 265 of the box-like structure 221. This evacuation causes the bare printed circuit board 242 to press down against the spring bias of the pin assemblies 249 and make contact with the contacts or pin ends 267 of the pogo pin assemblies 249, thereby applying electrical power to the conductive paths under test and, via the wire wrap interconnections on the stems 269 fo the pin assemblies 249, to the appropriate LEDs from the first or second groups 209, 211, respectively, which are then wired for display purposes, as previously described.

FIG. 3 is a front plan view of the upper part of cabinet 201 including the display panel portion 203. The display panel portion 203 includes a top 206, generally vertical, parallel sides 208, and a vertical front panel 204. The vertical panel 204 includes the AC power on/power off switch 215 and the ten position voltage selector or rotary switch 216 for selecting the number of conductors to be tested as a function of number of ribbon cables which must be connected. The front vertical panel 204 of the display portion 203 also includes a vacuum on/off toggle switch 219 and a power on/off indicator light or LED 218. A connector terminal 217 is included, and it may be cabled to a test head to pick up contacts on S3 which close when the vacuum pulls the cover 230 down. It can also be used for attaching a foot peddle control circuit.

The sloped surface 205 of the display panel portion 203 contains a first set or symmetrical arrangement or group array 209 of individual LEDs 210 generally arranged in columns and/or rows, as known in the art. Similarly, the display panel 203 includes a second set, group, symmetrical arrangement, or array 211 of LEDs 212 generally arranged in columns and/or rows for display purposes. The lower portion of the slanted face 205 of the display panel 203 includes a plurality of twenty electrical sockets for engaging the ribbon cable 214 of FIG. 1, as previously described.

Figure 4:
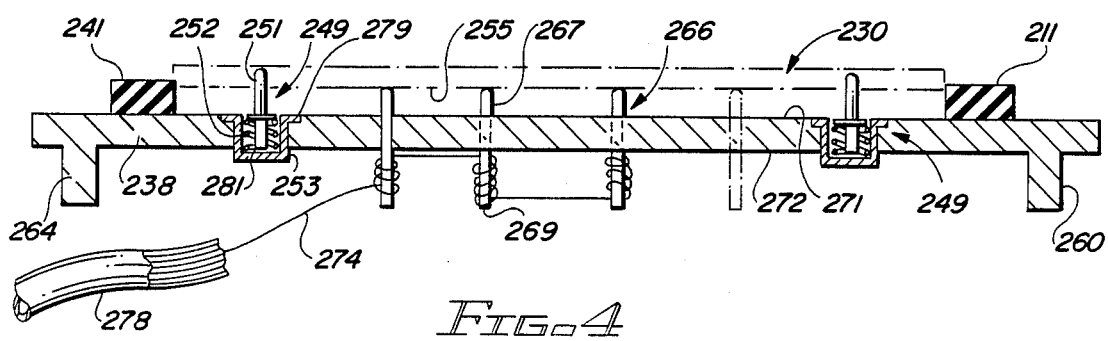
FIG. 4 is a front view showing the test fixture board carrying the test point-engaging contacts of the housing of FIG. 2.

FIG. 4 shows a sectional side view of the test fixture board 230 of FIG. 2 in greater detail. The test fixture board 230 is shown as having an upper surface 271 and a lower surface 272. The board is generally rectangular and includes a pair of legs 260, 264, for spacing the plane of the rectangular board a predetermined distance off of the base or floor of the housing 202. One or more locator pin assemblies 249 may be attached to the board 230. Each spring-biased alignment pin assembly 249 includes a generally cupped-shaped portion 253 having an upper annular lip 279 and a hollow interior 281. A spring 252 and pin member 251 are disposed within the hollow interior 281 for generally biasing the pin 251 up out of the cavity 281 and into an alignment aperature on the printed circuit board 242 to be tested. Pad-like standoffs may be used to further position the board or to rest the peripheral ends of the board thereon, if desired. The lower surface 255 of the printed circuit board 242 is normally spaced a slight distance away from the pin or contact portions 267 of the pogo pin assemblies 266, while the socket portions 268 pass through the board 230, and the downwardly distending stem portions 269 are wirewrapped by wire 274 to form the necessary interconnections for serially coupling all conductor paths via test points on the bottom 255 of the printed circuit board 242 to which the pins 267 make electrical contact. The wire wraps 541 on the stems 269 are connected via wires 274 and formed into wire bundles 278 which are then fed back to the sockets 229, and thence, via ribbon cables 214 and sockets 213, to the individual LEDs of group the one 209 LEDs and the group two LEDs 211.

The operation of the bare printed circuit board testing system or apparatus 200 of the present invention will now be described with respect to FIGS. 1-4. A bare printed circuit board 242 is generally made from some type of conventionally known "artwork". The boards may be extremely complex, and may include literally thousands of conductive paths 242 to be tested for short circuit and open circuit faults or errors. The testing apparatus 200 of the present invention is shown as being able to simultaneously test up to five hundred such conductive paths, but it will be obvious from the teachings hereof that far more could be tested with appropriate circuit modifications which would be obvious in light of the teachings set forth herein.

Since each conductive path to be tested can be defined as lying between two end points, all such points may be referred to as end points, test points, or terminals. These points lie on the rear side of the printed circuit board under test even though the actual conductive paths represented thereby may normally be located on the front side of the printed circuit board under test.

The housing 202 can be seen as a hollow box-like structure having verticle sides terminating in a rectangular peripheral lip and a central cavity. A test fixture board is operatively disposed within the hollow cavity on legs or the like. The artwork used to generate the actual printed circuit board under test is used, normally by physically securing it to the front surface of the test fixture board and conventional contacts such as pogo pin assemblies are mounted in the test fixture board at the locations dictated by the artwork such that each such pogo pin is positioned in a pattern so as to make contact with and correspond to one of the test points on the rears of the printed circuit board under test.

Each pogo pin assembly is inserted in a vertical position perpendicular to the plane of the test fixture board. The receptacle portion of the pin assembly is inserted through or positioned within an aperature in the test fixture board such that the upper end, pin end, or contact is vertically positioned a predetermined distance above the surface of the test fixture board. The stems, bases, tails or elongated, downwardly distended, connector portions extend vertically downward from and perpendicular to the bottom surface of the test fixture board.

Since the entire pin is conductive from contact end to stem, some conventional connector means, such as wire, is used to interconnect various test points and LEDs. The wire is wrapped on the stem and connected to the LEDs of the display panel through wire bundles and the ribbon cables. A given pogo pin, corresponding to a test point or one end point of a first conductive path to be tested, is connected via the wire wrap connection, wire, ribbon cable, and/or circuitry to a first LED of the first set or group of LEDs and then back to the stem of another pin assembly corresponding to one end point of the next conductive path to be tested, and so on until each and every one of the printed circuit board conductive paths to be tested are connected by different ones of the first set of LEDs and a single, continuous, series-connected circuit of conductive paths and first LEDs is formed.

Similarly, wire is wrapped about the stems of pin assemblies corresponding to one end point of a given conductive path to be tested and then to one of the LEDs of the second group and back to another pin assembly corresponding to the opposite end point of the conductive path under test so as to effectively wire one of said second LEDs into parallel with each of the series-connected paths and so on until each conductive path has an LED from the second group connected in parallel with it.

With this wiring arrangement, the LEDs of the first set or group are normally ON during system operation to indicate the absence of a short circuit condition in the paths under test. However, the LEDs from the first set turn or switch to an OFF condition to visually indicate the existance or detection of a short circuit condition. Furthermore, the location of the short is immediately determined, defined, or identified visually as well, as lying between the last LED which is ON before the first LED which is OFF and the last LED which is OFF before the first LED which is ON thereafter.

Similarly, this wiring arrangement also maintains the LEDs of the second set or group OFF during system operation to indicate the absence of an open circuit condition, but is responsive to the detection of an open circuit to visually indicate its existance by turning the appropriate LED ON. Further, the location of the detected open circuit condition is defined as bying in the precise conductive path which is connected in parallel with the ON LED from the second group.

The printed circuit board under test is placed on the locator pins over the test fixture board so that the pin ends of the pogo pin assemblies are disposed a short distance from the corresponding test points on the rear of the printed circuit board. Once the alignment and spacing is established, the cover is closed to provide an air tight seal to the cavity. The vacuum pump then creates a vacuum of between thirteen and twenty-seven inches of mercury within the cavity causing the board to move downward to engage the pin contacts thereby supplying test power to the conductive paths to be tested.

Since a large number of LEDs is required for testing bare printed circuit boards with a great many paths, a relatively high DC test voltage is required. By utilizing voltage divider means and repeat circuitry for distributing the load, sufficient power is uniquely made available for driving one thousand or more LEDs without damaging the LEDs or the circuit components. The voltage required is $nV_{DD}$ where "n" is the number of LEDs on the display panel and "$V_{DD}$" is the average voltage drop across each LED.

While the first group of LEDs has been described as normally ON and the second group as normally OFF, the states could be switched, but the present arrangement lowers or minimizes energy consumption. Similarly, if two colors of LEDs are used, all could be ON or OFF, as desired. Further, switching could be provided so that shorts and opens are tested separately, so that even more paths can be tested for a given number of LEDs.

Further, the testing system of the present invention can be used in the field. Similarly, it can be used in the fabrication process for layer-by-layer testing in multi-level or multilayer printed circuit boards.

Additionally, different bare printed circuit boards can be tested in the present system simply by preparing a new test fixture using the new artwork for determining pin placement and then wire wrapping the new stems to the LEDs, as previously described. Of course, the same fixture can be used to subsequently test, if proper corrections were made, and modified pin placements can provide added levels of assurance, confidence, or the like.

Figure 5:
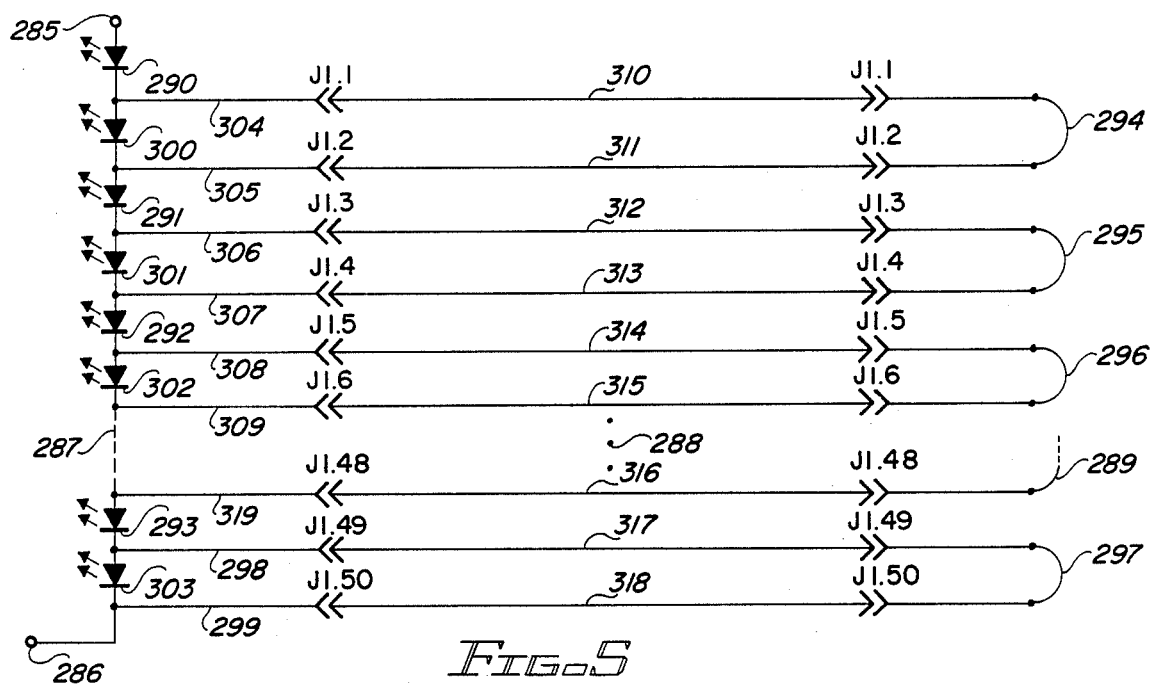
FIG. 5 is an electrical schematic diagram showing the manner in which the LEDs are connected to the test point-engaging contacts representing the conductive paths under test.

FIG. 5 illustrates the wiring arrangements of the present invention wherein each of the conductive paths of the printed circuit boards under test are given as conductive paths 310, 311, 312, 313, 314, 315, 316, 317, and 318. An indeterminate number of additional printed circuit board conductive paths 288 may lie between conductive paths 215, and 216, as represented by the dots labeled 288. The J1 junctions connect the respective conductive paths 310, 311, etc. to leads 304, 305, 306, 307, 308, 309, 319, 298, and 299, respectively via the junction terminals J1.1, J1.2, J1.3, ... J1.50.

The individual leads 304, 305, etc. are connected to a plurality of nodes between adjacent light-emitting diodes LEDs such that the input 285 is connected to the anode of LED 290 whose cathode is connected to lead 304. Lead 304 is also connected to the anode of a second LED 300 whose cathode is connected to lead 305. Lead 305 is connected to the anode of an LED 291 whose cathode is connected to lead 306 and to the anode of an LED 301 whose cathode is connected to lead 307. Lead 307 is also connected to the anode of LED 292 whose cathode is connected to lead 308 and to the anode of LED 302 whose cathode is connected to lead 309. The indeterminant dashed line representing an indeterminant number of LEDs between LED 302 and LED 293 are represented by reference numeral 287 and lead 319 is connected to the anode of LED 293 whose cathode is connected to lead 298 and to the anode of LED 303 whose cathode is connected to lead 299 and to the circuit output mode 286.

The second set of junctions, designated J1.1, J1.2, J1.3, ... J1.50, respectively, correspond to those junctions previously enumerated and adjacent conductive paths are connected as follows. Circuit path 310 is connected via lead 294 to circuit path 311 via junctions J1.1 and J1.2. Similarly, conductive path 312 is connected to conductive path 313 via lead 295 between junctions J1.3 and J1.4. Further, conductive path 314 is connected to path 315 via lead 296 between junctions J1.5 and J1.6. Conductive path 316 is connected to an indeterminate path 288 through lead 289 and junction J20.48, and conductive path 317 is connected to conductive path 318 through lead 297 and connecting J20.49 and J20.50.

In this manner, it will be observed that alternate ones of the LEDs are from the first group and are designated 290, 291, 292, and 293. These LEDs are connected in series with the conductive paths as follows. LED 290 is connected in series with conductive path 310 via lead 304 and with conductive path 311 through lead 294. LED 291 serially connects path 311 to path 312, while LED 292 serially connects path 313 to path 314 and LED 293 serially connects path 316 to path 317 so as to complete a single unitary series-connected path through all of the conductive paths under test 310-318 and the LEDs 290, 291, 292, and 293 of the first set of LEDs 209 as previously described. Similarly, individual LEDs 300, 301, 302, and 303 from the second group or set of LEDs 211 are connected in parallel across each of the conductive paths 294, 295, 296, and 297 (representing the pairs of paths connected by the leads so designated).

Figure 6:
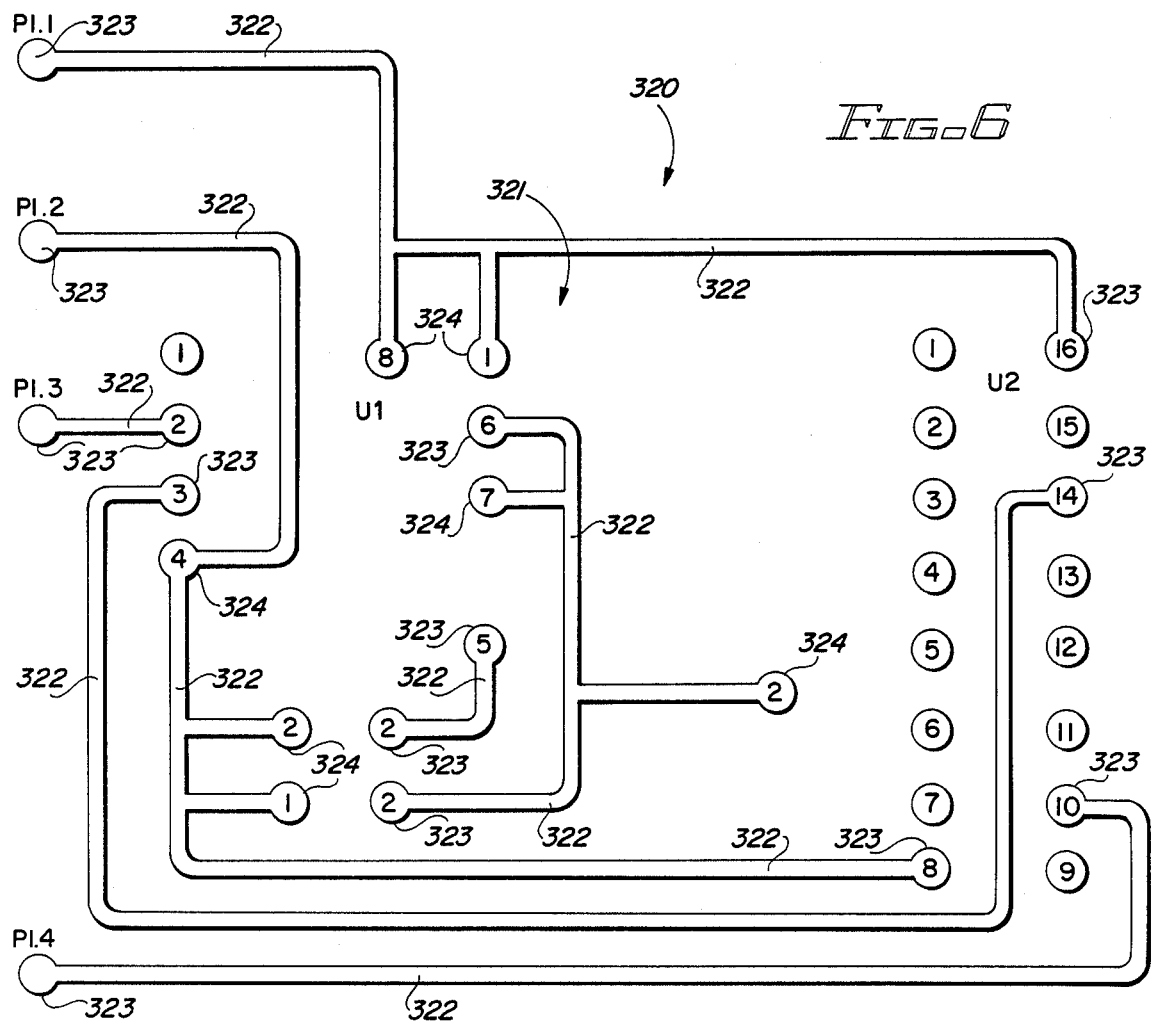
FIG. 6 is a schematic representation of a bare printed circuit board having a plurality of conductive paths and test points thereon.

FIG. 6 illustrates a printed circuit board 310 having a non-conductive printed circuit board portion 321 and a conductive portion which includes printed circuit board conductive path or lands 322; printed circuit board terminals or end points 323, and intermediate test points 324.

A typical assignment of the connections between the circuit of FIG. 5 and the test points of FIG. 6 are shown in Table A below in the same order as the LEDs of the display panel are shown for identification and locating purposes.

TABLE A

| J1.1 | P1.1 | J1.2 | U2.16 |
|---|---|---|---|
| J1.3 | P1.2 | J1.4 | U2.9 |
| J1.5 | P1.3 | J1.6 | U1.2 |
| J1.7 | U1.3 | J1.8 | U2.14 |
| J1.9 | C1.2 | J1.10 | U1.5 |

TABLE A-continued

| J1.11 | C2.2 | J1.12 | U1.7 |
|---|---|---|---|
| J1.13 | P1.4 | J1.14 | U2.10 |
| J1.15 | U1.1 | J1.16 | U1.1 |
| J1.17 | U2.1 | J1.18 | U2.1 |
| J1.19 | U2.2 | J1.20 | U2.2 |
| J1.21 | U2.3 | J1.22 | U2.3 |
| J1.23 | U2.4 | J1.24 | U2.4 |
| J1.25 | U2.5 | J1.26 | U2.5 |
| J1.27 | U2.6 | J1.28 | U2.6 |
| J1.29 | U2.7 | J1.30 | U2.7 |
| J1.31 | U2.9 | J1.32 | U2.9 |
| J1.33 | U2.11 | J1.34 | U2.11 |
| J1.35 | U2.12 | J1.36 | U2.12 |
| J1.37 | U2.13 | J1.38 | U2.13 |
| J1.39 | U2.15 | J1.40 | U2.15 |
| J1.41 |  | J1.42 |  |
| J1.43 |  | J1.44 |  |
| J1.45 |  | J1.46 |  |
| J1.47 |  | J1.48 |  |
| J1.49 |  | J1.50 |  |

Figure 7:
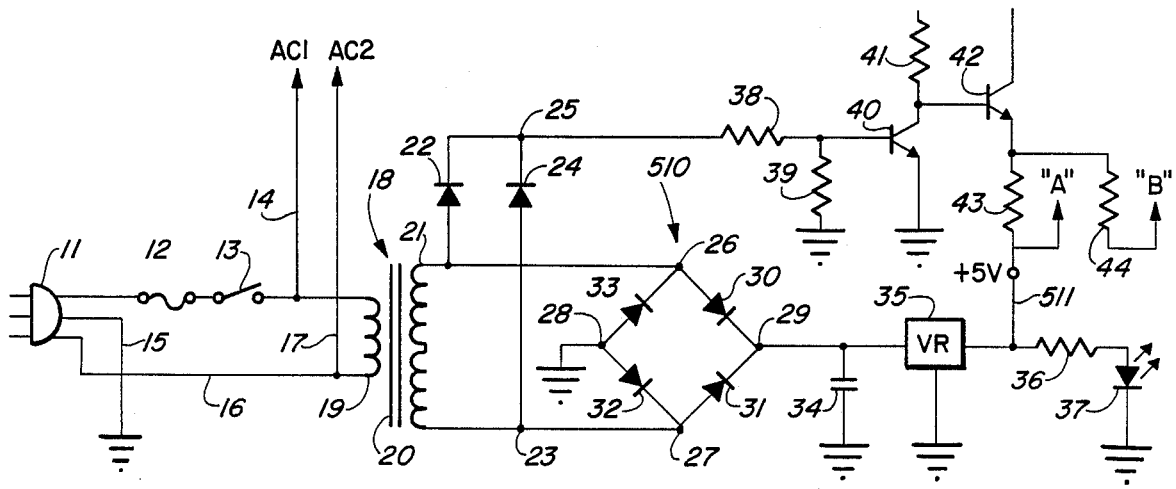
FIG. 7 is an electrical schematic diagram of the power supply portion of the present system.

FIG. 7 is an electrical schematic diagram of the power supply portion or circuit of the present invention. In FIG. 7, a conventional three prong AC electrical plug 111 is shown as having a first plug wire connected through a fuse 12 to the normally open arm of a switch 13. A second plug prong is connected directly to ground via lead 15, while a third is connected via lead 16 to one terminal of the primary coil 19 of a transformer 18. The Transformer 18 has a core 20 and a split secondary coil 21. The first terminal of the primary coil 19 also connects lead 16 to output the AC signal AC2 via lead 17. The normally-closed contact of switch 13 is connected to output the AC signal AC1 via lead 14 and is also connected to the opposite terminal of the primary coil 19.

One terminal of the split secondary coil 21 is connected to the anode of a diode 22 whose cathode is connected to node 25. The opposite terminal of the split secondary coil 21 is taken from node 23 and is connected to the anode of diode 24 whose cathode also connects to node 25 so that half rectified DC is present at node 25. Node 25 is connected through a resistor 38 to the base of an npn transistor 40. The base of transistor 40 is also connected to ground through a resistor 39. Resistors 38, 39 form a voltage divider for setting the threshhold for the zero cross-over pulse at the base of transistor 40. The emitter of transistor 40 is grounded while the collector is connected to one terminal of a resistor 41 and to the base of a second npn transistor 42 configured as an emitter follower. The emitter of transistor 42 is connected to output the signal "A" through a resistor 43 and to output the signal "B" through a resistor 44. The signals "A" and "B" are relatively small amplitude short, positive pulses.

The first terminal of the split secondary coil 21 is also connected directly to a first input node 26 of a full-wave rectifier bridge circuit 510, while the opposite terminal of the secondary coil 21 is connected to the second input node 27. The output of the bridge 510 is taken from node 29 while node 28 is grounded. Node 26 is connected through the anode of diode 30 whose cathode is connected to node 29. Similarly, input node 27 is connected to the anode of diode 31 whose cathode is connected to node 29. Node 28 connects to the anode of a diode 32 whose cathode is connected to node 27, and node 28 also connects to the anode of diode 33 whose cathode connects to input node 26.

The output of a full-wave rectifier bridge is taken from node 29 and connected directly to ground through a bulk filter capacitor 34 and to the input of a conventional voltage regulator 35. The output of the voltage regulator 35 supplies the +5V regulated DC signal on lead 511 and is connected through a resistor 36 to the anode of an LED 37 whose cathode is grounded.

This circuit converts an AC waveform into a half-rectified DC signal "A" and "B", for use as hereinafter described, and provides a full-wave rectified signal regulated at +5V on lead 511, for use as hereinafter described.

Figure 8:
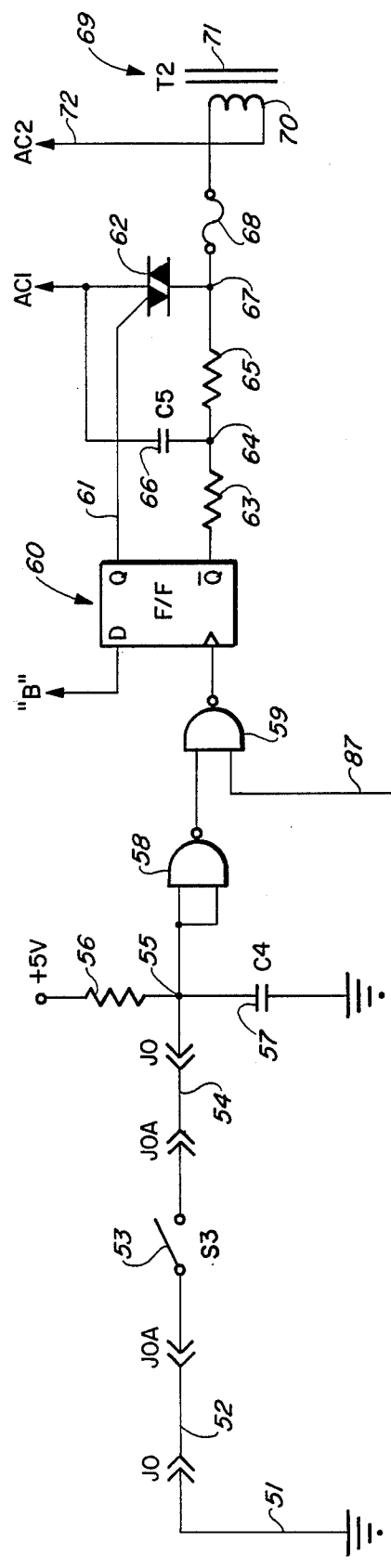
FIG. 8 is an electrical schematic diagram of the input portion and AC transformer primary circuit of the system of the present invention.

FIG. 8 is an electrical schematic diagram of the vacuum solenoid circuit and the pre-transformer circuitry of the present invention. Lead 51 is connected between ground and the terminal JO while a conductor 52 connects JO to JOA. JOA is connected to the normally open switch arm of switch 53 whose open contact is connected via junction JOA and connector 54 to junction JO. Junction JO is connected to node 55 which is connected to a +5V source of potential via resistor 56, to ground through a capacitor 57, and to both inputs of a two input logical NAND gate 58. The output of NAND gate 58 is connected to one input of a two input logical NAND gate 59 whose second input is connected to node 87 and whose output is connected to the clock input of a D-type flip-flop 60. The "D" input of flip-flop 60 is connected to receive the "B" signal from the power supply circuit of FIG. 7, as previously described.

And the non-inverting or "Q" output of flip-flop 60 is taken from lead 61 and connected directly to the gate electrode of a Triac 62. One conductive terminal of Triac 62 is connected directly to receive the AC signal AC1 and through a capacitor 66 to a node 64. The opposite terminal of Triac 62 is connected directly to a node 67. The inverting output $\bar{Q}$ of flip-flop 60 is supplied through a resistor 63 to node 64 which is then connected through a resistor 65 to node 67. Node 67 is connected through a fuse 68 to the first terminal of a primary transformer coil 70 whose opposite terminal connects to the AC2 source via lead 72. The transformer 69 includes a primary coil 70, a core 71, and a transformer secondary coil 110, as hereinafter described with reference to FIG. 9.

Node 73 is connected to ground and to the normally open switch arm of a switch 74 whose normally open contact is connected directly to node 75. Node 73 is connected through junction JO and lead 76 to junction JOA, and junction JOA is connected to the normally open switch arm of a switch 77 whose normally open contact is connected through junction JOA and connector 78 to junction JO and then directly to node 75. Node 75 connects to node 79. Node 79 is connected to a plus 5 volt source of regulated DC potential through a resistor 80 and to ground through a capacitor 81. Node 79 is also connected to both inputs of a logical NAND gate 82 whose output is connected to the "D" input of a D-type flip-flop 84 such that every hit of switches 74, 77, toggles the flip-flop 84. Both the set and the reset inputs of flip-flop 84 are connected to a plus 5 volt source of potential through leads 85 and 83, respectively.

The non-inverting or "Q" output is taken from node 86 and connected via lead 87 and to both inputs of a logical NAND gate 88. The output of NAND gate 88 is connected to the clock input of a D-type flip-flop 89 whose "D" input is connected via lead 90 to the signal "A". The non-inverting or "Q" output is taken on lead 91 and connected to the gate electrode of a triac 92. One terminal of triac 92 is connected via lead 93 to the AC source AC1 and through a capacitor 94 to node 95. The opposite terminal of triac 92 is connected directly to node 96. The inverting or $\bar{Q}$ output of flip-flop 89 is connected through a resistor 97 to node 95, and then through a resistor 98 to node 96. Node 96 is connected through a fuse 99 and conductor or lead 100 to junction J22 which is connected via lead 101 to one terminal of the solenoid coil 104 and back via lead 105 and junction J22 to receive the signal AC2 on lead 106. The vacuum solenoid 102 has a coil 104 and a core 103 and is used to operate the vacuum as previously described.

As flip-flop 84 toggles back and forth with the switch hits, the output of NAND gate 88 alternates between logical high and logical low states thereby toggling flip-flop 89. Flip-flop 89 then alternately enables and disenables the optical isolator triac driver 92. Capacitor 94 is a snubber circuit for preventing false triggering of the triac 92 and the triac drive 92 is thus on only during the first cycle.

Figure 9:
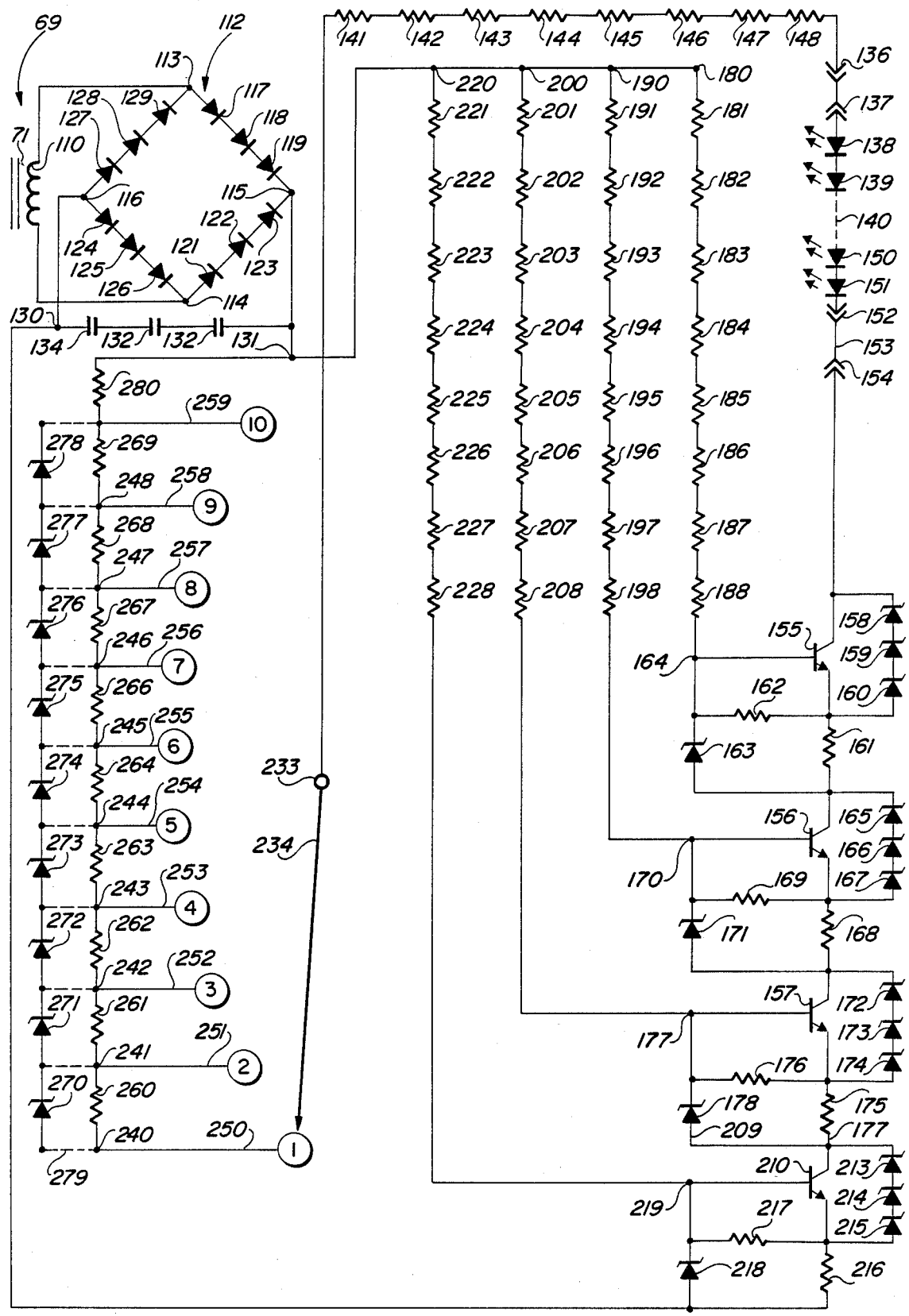
FIG. 9 is an electrical schematic diagram of the remaining portion of the circuit of FIG. 8 coupled to drive the LEDs of the display panel portion of FIG. 1.

The transformer 69 including the primary coil 70 of FIG. 8, core 71, and the secondary coil 110 of FIG. 9 has the first terminal of the secondary coil 110 connected directly to the first input node 113 and the opposite terminal of the secondary coil 110 connected to the second input 114 of a full-wave bridge rectifier circuit 112. The first output of the bridge circuit is taken from node 115 while the second output is taken from node 116. Node 113 is connected to the anode of a diode 117 whose cathode is connected in series to the anode of a diode 118 whose cathode is in turn connected in series to the anode of a diode 119 whose cathode is then connected to the output node 115. Similarly, the second input node 114 is connected to the anode of a diode 121 whose cathode is connected in series to the anode of a diode 122 whose cathode is connected in turn to the anode of a diode 123 whose cathode is also connected to output node 115.

The second output node 116 is connected to the anode of a diode 124 whose cathode is connected to the anode of a diode 125 whose cathode is connected to the anode of a diode 126 whose cathode is connected to the second input node 114. Lastly, node 116 is connected to the anode of diode 124 whose cathode is in turn connected to the anode of a diode 125 whose cathode is connected in series with the anode of a diode 126 whose cathode is connected to input node 114.

The configuration and construction of the full-wave rectifier bridge circuit 112 is conventional, except for the fact that the voltage across the secondary coil is a relatively high voltage and the bridge circuit 112 must be able to rectify a large AC input voltage. For this purpose, since the voltage drop across a typical LED is about 1.6–2.2 volts, and since 1000 LEDs may be used in the test circuit of the preferred embodiment of the present invention, at least 1600 to 3000 volts must be used. Therefore, since diodes do not normally exist which can handle more than a thousand volts, three successive thousand volt diodes are used in each leg of the bridge 112. Similarly, the output node 115 is connected to the input node 116 via node 130, and the series combination of capacitors 132, 133, and 134. Similarly, three capacitors are used to share or distribute the required high DC voltage at the output of the bridge 115, and each capacitor 132, 133, and 134 has a capacity of or is rated at least 1000 volts. The output node 115 is also connected directly to node 131, and node 131 is connected via lead 135 to a node 180.

A junction 136 connects through a lead to a junction 137 and then to the anode of a light-emitting diode 138 whose cathode is connected to the anode of another light-emitting diode 139, and so on, as represented by the uncertain dots of reference numeral 140, until LED 150 has its cathode connected to the anode of LED 151 and then through junction 152, lead 153 and junction 154 to the collector electrode of a first npn transistor 155. The circuit also includes a second npn transistor 156, a third npn transistor 157, and a fourth npn transistor 210.

The junction 136 is connected to a lead 231 through the series combination of a plurality of individual discrete resistive elements 141, 142, 143, 144, 145, 146, 147, and 148. This series of eight resistor elements is used for both voltage divider purposes and for heat dissipation and the like, as known in the art. Lead 231 is connected via pivot point 233 to a manually-positionable decade switch arm 234.

Node 131 is connected via lead 135 to node 180, as previously described. Node 180 is then connected to the base input node 164 of transistor 155 through the series combination of eight discrete resistors designated 181-1–8, respectively. Node 164 is connected directly to the base of transistor 155 while the emitter of transistor of 155 is connected back to the collector thereof by the series combination of zener diodes 158, 159, and 160. The emitter is connected to the anode of zener diode 160 whose cathode is connected to the anode of zener diode 159 whose cathode is connected to the anode of zener diode 158 whose cathode is then connected back to the collector of transistor 165 and then to junction 154. The emitter output is also connected through a resistor 161 to the collector of transistor 156 and through a resistor 162 the base input node 164. The collector of transistor 156 is also connected through the anode of a zener diode 163 to the base node 164 of transistor 155.

Node 180 is also connected to node 190 through a lead 512. Node 190 is connected through a series of eight individual discrete resistor elements or resistors 191-198, respectively, to the base input node 170 of the second transistor 156. The emitter of transistor 156 is connected through a series of three zener diodes 165, 166, and 167 back to the collector transistor 156. Zener diode 167 has its anode connected to the emitter of transistor 156 and its cathode connected to the anode of zener diode 166 whose cathode is connected to the anode of a zener diode 165 whose cathode connects back to the collector of transistor 156. The emitter of transistor 156 is also connected thrugh a resistor 168 to the collector of transistor 157 and through a resistor 169 to base node 170. The collector of transistor 157 is further connected to the anode of a zener diode 171 whose cathode is also connected back to the base input node 170 of transistor 156.

Lead 513 connects node 190 to node 200, and node 200 is connected through a series of eight individual different and distinct resistors 201-208 respectively, to the base input node 177 of the third transistor 157. The emitter of transistor 157 is connected to the collector through the series combination of three zener diodes 172, 173, and 174. The emitter of transistor 157 is connected to the anode of zener diode 174 whose cathode is connected to the anode of zener diode 173 whose cathode is connected to the anode of zener diode 172 whose cathode connects directly to the collector of transistor 157. The emitter of transistor 157 is also connected through a resistor 175 to a lead 177 and through a resistor 176 to the node 179 which corresponds to the base node 177 of transistor 157. Node 179 is also connected to the cathode of a zener diode 178 whose anode is connected via lead 209 to lead 177. Node 200 is connected via lead 215 to node 190 and also, via lead 514 to the series combination of eight individual, different and distinct resistors 221-228 and then to the base input node 219 of the fourth and last transistors 210. The emitter of transistor 210 is connected to the collector node 211 through the series combination of zener diodes 213, 214, and 215. The anode of zener diode 215 is connected directly to the emitter of transistor 210 while the cathode is connected to the anode of zener diode 214 whose cathode is connected to the anode of zener diode 213 whose cathode is connected directly to node 211.

Node 211 or the collector of transistor 210 is connected via lead 212 directly to the lead 177. The emitter is also connected to the lead 177 through resistor 216 and is further connected through a resistor 217 to the base input node 219. The base input node 219 is then connected to the cathode of a zener diode 218 whose anode is connected to lead 177. Lead 177 connects directly back to node 130 and thence to the second output 116 of the bridge 112 and to the series capacitors 134, 133, and 132, as previously described.

As previously stated, the manually-positionable decade switch arm or voltage divider arm 234 pivots on 233, and its contact end, contrary to the misaportioned drawing of FIG. 9, can contact any one of the decimal position contacts labled 1–10, respectively. The switch arm 234 can contact the first decade switch position which is connected via lead 250 to node 240. Node 240 is connected through a resistor 260 to node 241 and node 241, is connected via lead 251 to the second decade position. Node 241 is also connected through resistor 261 to node 242 which is connected via lead 252 to the third decade position.

Node 242 is then connected through resistor 262 to node 243 which is connected via lead 253 to the fourth decade position. Node 243 is connected through resistor 263 to node 244 which is connected via lead 254 to the fifth decade position, while node 244 connects resistor 264 to node 245, and thence via lead 255 to the sixth decade position. Node 245 is connected through resistor 266 to node 246 which is connected via lead 256 to the seventh decade position, and node 246 is further connected to node 247 through a resistor 267. Node 247 is connected via lead 257 to the eighth decade position. Node 247 is connected through resistor 268 to node 248 and via lead 258 to the ninth decade position, and node 248 is connected through resistor 269 to node 249. Node 249 is connected via lead 259 to the tenth decade position, and through a resistor 280 to node 131, as previously described.

In the preferred embodiment, rather than using resistors 260-269, a plurality of series-connected, equal-valued zener diodes 270-278 are used. As represented by the dotted line 279, the zener diodes and the resistors are interchangeable. Node 240 would then be connected to the anode of zener diode 270 and the cathode of diode 270 would be connected to the anode of the next diode 271 whose cathode would be connected to the anode of a diode 272 and so on until zener diode 277 had its cathode connected to the anode of diode 278 which had its anode connected to node 249.

In the preferred embodiment, each of the values of the resistors 260-269 are equal and each supports a voltage drop of approximately 200 volts more than the previous one. Similarly, each of the zener diodes 270-278 has a voltage drop of approximately 200 volts so that the total across the series string is equal to 2000 volts or that necessary to drive the one thousand-LEDs, as previously described. In this manner, the LEDs have sufficient power for drive purposes while the remainder of the circuit elements are protected from high voltage conditions and the like.

Figure 10:
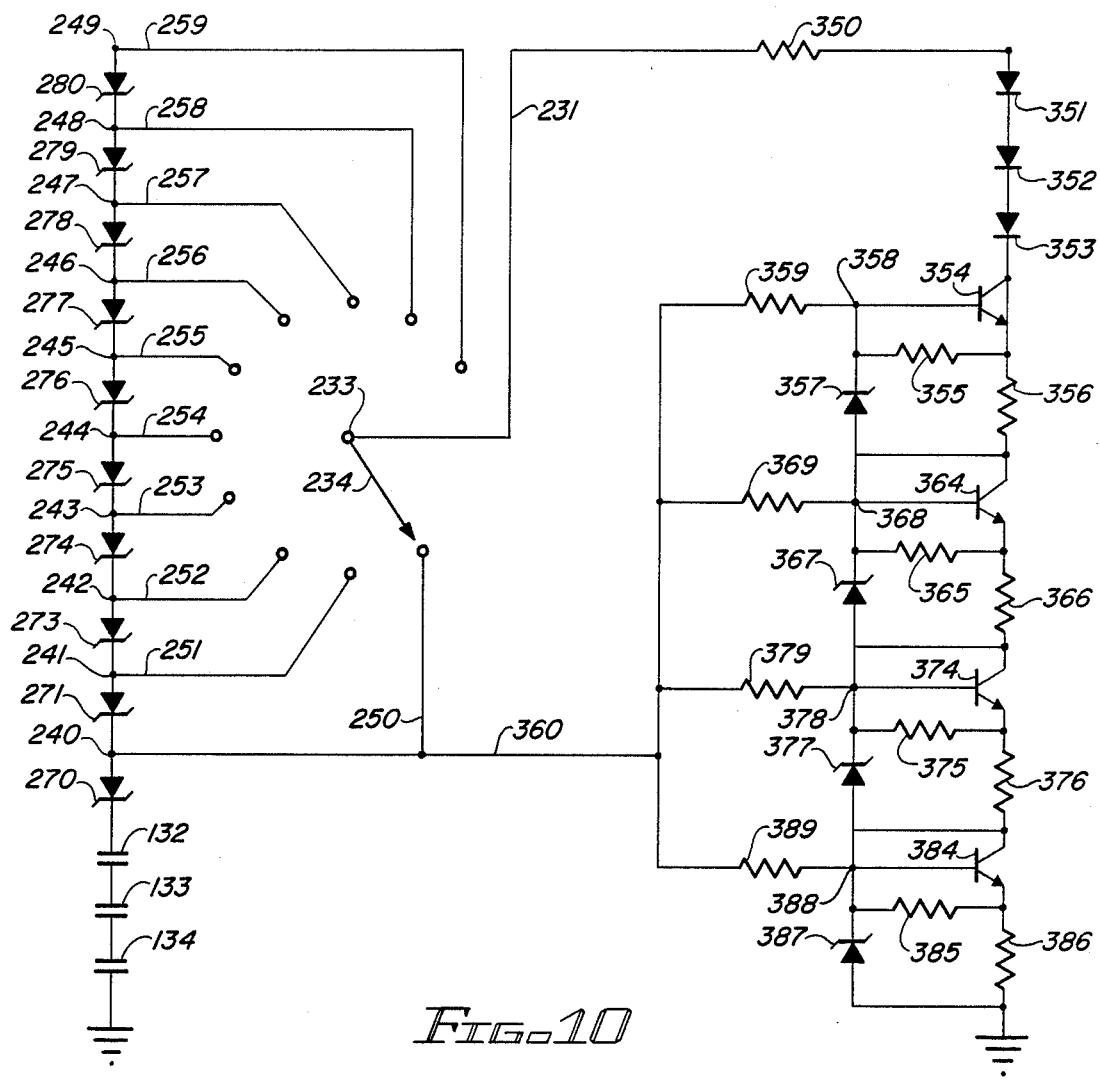
FIG. 10 is an electrical schematic diagram of an alternate embodiment of a portion of the circuit of FIG. 9.

FIG. 10 illustrates an alternate embodiment of a portion of the circuit of FIG. 9 using far fewer elements. In FIG. 10, the cathode of a zener diode 270 is connected to ground through the series combination of capacitors 132, 133, and 134. The anode of zener diode 270 is connected to node 240. Node 240 is connected to lead 360 and via lead 250 to the first decade switch position of the decade switch comprising switch arm 234 and pivot 233. The second decade switch position is connected via lead 251 to node 241, while the third switch position is connected via lead 252 to node 242. The fourth decade switch position is connected via lead 253 to node 243, and the fourth decade switch position is connected via lead 254 to node 244. The fifth decade position is connected via lead 255 to node 245 while the sixth is connected via lead 256 to node 256. The seventh decade position is connected via lead 257 to node 247 while the eighth decade position is connected via lead 258 to node 248. Node 249 connects to the ninth decade position via lead 259 and the node 249 connects via lead 259 to the tenth and final decade position.

The switch pivot or commutator point 233 is connected via lead 231 to one terminal of a resistor 350 whose opposite terminal is connected through three series-connected diodes 351, 352, and 353 to the collector of transistor 354. The anode of diode 351 is connected to the resistor 350 while the cathode is connected to the anode of diode 352 whose cathode is connected to the anode of the third diode 353 whose cathode is connected directly to the collector of transistor 354. The base of transistor 354 is connected directly to the base node 358 which is connected through a resistor 359 to lead 360 and thence back to node 240 and through a resistor 355 to the emitter of transistor 354. The emitter of transistor 354 is connected through a resistor 356 to the collector of a second transistor 364 while the collector of transistor 364 is also connected to the anode of a zener diode 357 whose cathode is connected back to the base input node 358 or transistor 354.

The base input node 368 of transistor 364 is connected through a resistor 365 directly to the emitter of transistor 364 and the emitter is connected through a resistor 366 to the collector of transistor 374. The collector of transistor 274 is connected to the anode of a zener diode 267 whose cathode is connected directly back to the base input node 368, and node 368 is connected through a resistor 369 to lead 360. The base of transistor 374 is connected directly to the base input node 378 which is connected through a resistor 375 directly to the emitter of transistor 374. The emitter is also connected through a resistor 376 directly to the collector of transistor 384. The collector of transistor 384 is also connected to the anode of a zener diode 377 whose cathode is connected to the base input node 378 which is then connected through a resistor 379 back to the lead 360.

The base of transistor 384 is connected directly to base input node 388, which is connected through a resistor 385 directly to the emitter of transistor 384. The emitter is also connected via resistor 386 to ground, and the base node 388 is connected to the cathode of a zener diode 387 whose cathode is grounded. The base input node 388 is further connected through a resistor 389 to lead 360. Lead 360 is connected via lead 250 to the first decade position and directly to node 240.

Therefore, the circuit of FIG. 10 can be used to selectively control given multiples of voltage drops, such as 240 volts each, which are to be used for voltage divider purposes in the circuit of the present system so that a relatively large voltage, much higher than that which could normally be used by any one of the components in and of themselves, can be divided among three or more components to provide sufficient voltage drops for the LEDs and sufficient protection for the overall circuit.

It should be understood that the term printed circuit board is a generic term and here applies to any form of interconnection technology, and includes, but is not limited to, flex, multilayer, rigid-flex, punched, plated, multiwire, wire wrap, etc.

It will be understood to those knowledgeable or skilled in the prior art, that various modifications, substitutions and revisions can be made in the mechanical apparatus and in the particular circuitry described in the preferred embodiment, without departing from the spirit and scope of the present invention which is limited only by the appended claims.

I claim:

1. An apparatus for testing a bare printed circuit board for short circuit and open circuit conditions, said bare printed circuit board being made from printed circuit board artwork and said bare printed circuit board having an upper surface for mounting electrical components and a lower backplane surface having a plurality of test points thereon, said testing apparatus comprising:

a cabinet portion having a visual display panel and a housing means;

said display panel including a first group of symmetrically arranged illumination means for visually indicating both the existence and the location of a short circuit condition and a second different and distinct group of symmetrically arranged illumination means for visually indicating both the existence and the location of an open circuit condition;

said housing means operatively enclosing a test fixture means therein, said test fixture means including a plurality of test-point engaging electrical contacts configured in a pattern determined by said printed circuit board artwork used to make said bare printed circuit board under test, said contacts corresponding to test points defined at least at the ends of the conductive paths to be tested;

first electrically conductive means for operably connecting a different and distinct one of said first group of illumination means in series between a first test point-engaging contact for electrically contacting one end point of a given conductive path to be tested and another test point-engaging contact for electrically contacting one end point of another conductive path to be tested such that a different and distinct one of said illumination means of said first group of illumination means is physically and electrically connected between each one of said conductive paths to be tested for forming a single continuous series-connected circuit path alternately through all of said conductive paths to be tested for shorts and through at least an equal number of said illumination means of said first group of illumination means;

second electrically conductive means for operably connecting a different and distinct one of said second group of illumination means across a given pair of test point-engaging contacts for connecting same in parallel across a given one of said conductive paths to be tested until each of said conductive paths to be tested has a different and distinct one of said illumination means of said second group of illumination means thereacross when contact with said test points at opposite ends of each of said consecutive paths is made;

means for supplying electrical power to said pattern of test point-engaging electrical contacts;

means for operably receiving the bare printed circuit board under test in alignment with the contact pattern of said test fixture means;

means for effecting electrical contact between said test point-engaging electrical contacts of said pattern and the end points of each conductive path to be tested on the backplane of said bare printed circuit board under test for supplying power to said conductive paths;

said first group of illumination means normally being in a first predetermined state to indicate the absence of a short circuit condition, said first group of illumination means being responsive to the existence of a short circuit condition in at least one of said conductive paths to be tested for switching to a second predetermined state which is opposite to said first predetermined state, the location of said detected short circuit condition being defined as lying between the last one of said first group of illumination means which is in said first predetermined state before the first one of said first group of illumination means which is in said second opposite predetermined state and the last one of said first group of illumination means which is in said second opposite predetermined state before the first one of said first group of illumination means which is in said first predetermined state thereafter; and said second set of illumination means normally being in said second opposite predetermined state for indicating the absence of an open circuit condition and being responsive to the existence of an open circuit condition for switching at least a particular one of said second group of illumination means to said first predetermined state to indicate the existence of said open circuit condition;

the location of said detected open circuit condition being defined as lying within that particular conductive path under test corresponding to that particular illumination means of said second group of illumination means which switched to said first predetermined state and which is electrically connected in parallel therewith;

said illumination means including light-emitting diodes;

said means for supplying electrical power to said contact pattern includes:

AC transformer means having a secondary for producing a relatively high voltage output;

a full-wave rectifier means including a rectifier bridge having a pair of inputs and a pair of outputs, the pair of inputs of said bridge rectifier means being operatively coupled across said secondary and said pair of outputs supplying a relatively high voltage rectified DC signal of at least $nV_{DD}$ where "n" is the number of light-emitting diodes on said display panel and "$V_{DD}$" is the voltage drop across each said light-emitting diodes;

a plurality of transistor means operatively coupled as emitter followers between the outputs of said full-wave rectifier means;

a series-connected circuit of alternate ones of said first and second groups of light-emitting diodes operably connected between said outputs of said full wave rectifier means;

means operably couple between said series-connected circuit of alternate light-emitting diodes and one output of said rectifier means, said operably coupled means including a decade switch means for proportionally dividing the relatively high DC voltage across each of said first and second pluralities of transistor means associated with each of said first and second groups of illumination means for providing sufficient current for driving said light-emitting diodes while protecting said transistor means and said light-emitting diodes.

2. The testing apparatus of claim 1 wherein each leg of said full-wave rectifier bridge means includes a plurality of series-connected high voltage diodes.

3. The testing apparatus of claim 1 wherein each leg of said full-wave rectifier bridge means includes three high voltage diodes each having a voltage drop of approximately 1000 volts.

4. The testing system of claim 1 wherein said first group of light-emitting diodes has a first characteristic color and said second group of light-emitting diodes has a second different and distinct characteristic color.

5. The testing apparatus of claim 1 wherein said first group of light-emitting diodes includes as many as 500 LEDs, said second group includes as many as 500 LEDs, for a total of as many as 1000 LEDs associated with said display panel.

6. The testing apparatus of claim 5 wherein the total voltage drop across said plurality of LEDs is over 2000 volts.

7. The testing apparatus of claim 5 wherein said power supply means provides over 2000 volts of DC power and voltage divider means is provided for programmably controlling the voltage drop across the light-emitting diodes to provide sufficient power for driving same while preventing damage thereto.

8. The testing apparatus of claim 2 wherein said first and second groups of illumination means each include a relatively large number of light-emitting diodes.

9. The testing apparatus of claim 1 wherein said first predetermined state is ON and said second opposite predetermined state is OFF.

10. The testing apparatus of claim 2 wherein said housing means is closed on all but one side;

wherein said housing further includes a cover means operably disposed thereon and closeable to seal the open side of said housing to provide an airtight cavity therewithin;

said test fixture means being such that the rear surface of said bare printed circuit board under test is disposed a predetermined spaced distance from said contact pattern; and said means for effecting contact between said contact pattern and said test points includes vacuum means for evacuating said cavity and drawing the rear surface of said bare printed circuit board under test into physical and electrical contact with the test point-engaging contacts of said test fixture means for testing purposes.

11. The testing apparatus of claim 10 further including manually-actuable means for actuating said vacuum means only after said cover is closed.

12. The testing apparatus of claim 11 wherein said manually-actuable means includes at least one of a hand-operated switch means and a foot-operated switch means.

13. The testing apparatus of claim 1 wherein said full-wave rectified bridge means includes a plurality of series-coupled high voltage capacitors operatively connected between the pair of outputs thereof.

14. The testing apparatus of claim 13 wherein said plurality of said capacitors includes three series-connected capacitors each having a capacity of at least 1000 volts.

15. The testing apparatus of claim 1 wherein said means for proportionally dividing said relatively high DC voltage includes:
a decade switch means including a series of ten individually selectable impedance means and a commutator arm for manually selecting any one of ten impedance values for dropping voltages between 0 and $nV_{DD}$;
a first plurality of individual resistors serially connected between said plurality of series-connected LEDs and said commutator arm;
a second plurality of individual resistors serially connected between the base of a first one of said plurality of transistor means and one terminal of said series-connected impedance means;
other pluralities of individual resistors, one of each such pluralities connected between the base of each successive transistor means and said one terminal;
a final plurality of individual resistors connected between the base of the last transistor means and said one terminal; and
means for connecting said one terminal to the first output of said rectifier means and means for selectively electrically coupling successive junctions between adjacent series-connected impedance means to said manually-positionably commutator arm.

16. The testing apparatus of claim 15 wherein each of said plurality of transistors includes a plurality of series-connected high voltage zener diodes operatively coupled between the collector and emitter thereof.

17. The testing apparatus of claim 16 wherein each of said plurality of high voltage zener diodes includes three zener diodes each capable of dropping at least one thousand volts and said each of said zener diodes being poled with its anode toward said emitter and its cathode poled toward said collector.

18. The testing apparatus of claim 16 wherein each of said transistors includes a first resistive means operatively coupled between its emitter and the collector of the next transistor, a second resistive means operatively coupled between its emitter and base, and a zener diode coupled between its base and the collector of the next successive transistor.

19. The testing apparatus of claim 15 wherein the connection of the base of the last of said transistor means to the second output of said bridge rectifier means includes a current source-generating means.

20. The testing apparatus of claim 19 wherein said current source means include a zener diode having its cathode connected to the base of the last of said transistor means and its anode connected to the second output of said rectifier means.

21. The testing apparatus of claim 15 wherein each of the ten impedance means of said decade switch means includes a resistor and each of said resistors has an equal value.

22. The testing apparatus of claim 21 wherein the voltage drop across each of said decade resistors is equal to $nV_{DD}$ where "n" is equal to the number of LEDs being used and "$V_{DD}$" is the voltage drop across each of said LEDs.

23. The testing apparatus of claim 15 wherein each of said impedance means is defined by the voltage drop across a high voltage zener diode and each of said zener diodes is identical.

24. The testing apparatus of claim 23 wherein the voltage drop across each of said zener diodes is given by $nV_{DD}$ where "n" is the number of LEDs in said group and "$V_{DD}$" is the average voltage drop across each of said LEDs.

25. A system for simultaneously testing for the existence of both short circuit conditions and open circuit conditions in a relatively large plurality of conductive paths of a bare printed circuit board while simultaneously and substantially immediately indicating the precise location of any detected short circuit condition and the precise location of any detected open circuit condition with all of the testing of said desired conductive paths being simultaneously completed within an extremely short period of time, said system comprising:
a housing including a display panel and a test fixture enclosure having a hollow interior;
said display panel including a first set of light-emitting diodes displayed in a first symmetrical arrangement and a second set of light-emitting diodes displayed in a second symmetrical arrangement;
said printed circuit board having a top surface for mechanically and electricallly receiving electrical components thereon and a rear surface including a plurality of terminals thereon, a pair of said terminals existing at least at the opposite ends of each of the conductive paths to be tested on said bare printed circuit board under test;
a test fixture board including a plurality of terminal-engaging contacts arranged in a pattern determined by the artwork used to generate said bare printed circuit board under test fcr operatively engaging each of the terminals at the ends of said conductive paths to be tested, said test fixture board being operably disposed within said hollow interior of said housing;
means for aligning said bare printed circuit board under test with said contact pattern of said test fixture board, said board also including means for spacing the rear surface cf said bare printed circuit board under test a predetermined spaced distance from and in alignment with said terminal-engaging contacts;
wiring means for operatively connecting said configuration of terminal-engaging contacts to said LEDs;
means for applying electrical power thereto such that said first set of LEDs is normally ON to indicate the absence of a short circuit condition, one or more of said first set of LEDs being OFF in response to the detection of a short circuit condition for indicating the existence thereof, the location of said detected short circuit condition being defined as lying between the last one of the first set of LEDs which is ON before the first one which is OFF and the last one of said first set of LEDs which is OFF before the first one which is ON thereafter; and means for operatively coupling individual ones of said second set of LEDs across the end terminals of each of said conductive paths and in parallel therewith for normally maintaining said second set of LEDs OFF in the absence of an open circuit condition, said second set of LEDs being responsive to the existence of an open circuit condition for turning ON to indicate the detection thereof, the location of said detected open circuit condition being defined as lying within the particular conductive path across which said illuminated LED from said second set is connected;

a source of AC potential;

a transformer having a primary coupled to said source of AC potential and a secondary for producing a relatively high AC voltage;

full-wave rectifier bridge means having a pair of inputs operatively coupled to the opposite ends of said secondary and a pair of outputs for producing a relatively high voltage rectified DC signal of at least $nV_{DD}$ where "n" is equal to the number of LEDs in said first and second set and "$V_{DD}$" is equal to the average voltage drop across said LEDs;

a plurality of transistor means connected in series with said LEDs for distribution the voltage applied thereto; and voltage divider means for ensuring that sufficient power is supplied to drive said LEDs while protecting the circuit from over-voltage conditions; and said plurality of transistors including a set of four transistors connected with the emitter of one transistor being operatively coupled to the collector of the next to act as emitter followers operatively coupled between said series-connected LEDs and the outputs of said rectifier means.

26. The test system of claim 25 wherein each of said transistors includes a plurality of individual and discrete series-connected resistors operatively coupled between the rectifier output and the base thereof.

27. The testing system of claim 26 wherein said full-wave rectifier bridge means includes a bridge having four legs, each of said legs including a plurality of high-voltage diodes connected in series therewith.

28. The test system of claim 27 wherein each of said legs includes at least three high voltage diodes and each of said diodes is capable of dropping at least 1000 volts.

29. The test system of claim 24 wherein said rectifier means includes a series of capacitors connected between the first and second outputs of said rectifier means.

30. The test system of claim 29 wherein each of said plurality of said capacitors includes at least three capacitors, each having an equal value and capable of handling at least 1000 volts.

31. The test system of claim 26 wherein all but the last of said transistors function as voltage dividers with the last transistor serving as an emitter follower.

32. The test system of claim 26 wherein said circuit means further includes a manually-operable decade switch having a selector arm, ten discrete voltage divider impatience means operatively connected in a series circuit path, and ten switch positions each corresponding to the addition of a different voltage divider impedence means for selecting ten different and distinct impedance values, said manually positionable selector arm being operabely coupled through said series-connected resistors, and said series-connected LEDs to the collector of the first one of said coupled transistors.

33. The test system of claim 32 wherein each of said impedance means includes a resistor and each resistor has a value equal to that of the other resistors.

34. The test system of claim 33 wherein each of said resistors has a value equal to $nV_{DD}/10$ where "n" is the number of LEDs on said display panel and "$V_{DD}$" is the average value of the voltage drop across each of said LEDs.

35. The test system of claim 32 wherein each of said impedance means includes a zener diode having a voltage drop of at least $nV_{DD}/10$ where "n" is the number of LEDs on said display panel and "$V_{DD}$" is the average value of the voltage drop across each of said LEDs.

36. The test system of claim 32 wherein said series-connected impedance means of said decade switch and the circuit path including said transistor means and said series-connected LEDs being connected in parallel across the outputs of said rectifier means.

37. The test system of claim 36 wherein the last transistor of said series of transistors further includes a zener diode having its cathode connected to the base of said last transistor and its anode connected to one of said rectifier outputs for providing a current source for driving said LEDs.

38. The test system of claim 25 wherein said test fixture housing further includes a cover for sealing said test fixture means and said printed circuit board under test within said hollow interior in an airtight manner, and means for indicating when the cover is closed for sealing said cavity for enabling said vacuum means to be operated.

39. The test system of claim 38 wherein the initiation of said vacuum means includes at least one of a manually-operated switch designed for hand operation and a manually-operated switch designed for foot operation.

40. The test system of claim 38 wherein said housing further includes a protective covering over the rear of said contact network for preventing operator injury which might otherwise result from the high voltage utilized therein.

* * * * *